United States Patent [19]
Urabe

[11] Patent Number: 6,080,667
[45] Date of Patent: Jun. 27, 2000

[54] METHOD OF TREATING CVD TITANIUM NITRIDE WITH SILICON IONS

[75] Inventor: Koji Urabe, Tokyo, Japan

[73] Assignee: NEC Corporation, Tokyo, Japan

[21] Appl. No.: 09/190,815

[22] Filed: Nov. 12, 1998

[30] Foreign Application Priority Data

Nov. 14, 1997 [JP] Japan ..................................... 9-331210

[51] Int. Cl.⁷ ..................................................... H01L 21/44
[52] U.S. Cl. ........................................... 438/659; 438/658
[58] Field of Search ..................................... 438/597, 658, 438/659, 660

[56] References Cited

U.S. PATENT DOCUMENTS

| 5,885,896 | 3/1999 | Thakur et al. ........................... 438/649 |
| 5,940,726 | 8/1999 | Yu ........................................... 438/597 |
| 5,960,319 | 9/1999 | Iwata et al. .............................. 438/664 |

FOREIGN PATENT DOCUMENTS

| 61-156837 | 7/1986 | Japan . |
| 7-331410 | 12/1995 | Japan . |
| 8-97212 | 4/1996 | Japan . |

*Primary Examiner*—Charles Bowers
*Assistant Examiner*—Evan Pert
*Attorney, Agent, or Firm*—Young & Thompson

[57] ABSTRACT

A titanium nitride film is formed on a silicon substrate having a contact hole formed therein by chemical vapor deposition and silicon ions are injected. Therefore, it is possible to reduce the film stress of the titanium nitride film, caused by the chemical vapor deposition, to the semiconductor device.

4 Claims, 2 Drawing Sheets

METHOD OF TREATING CVD TITANIUM NITRIDE WITH SILICON IONS

BACKGROUND OF THE INVENTION

1. Field of the Invention

The present invention relates to a method for manufacturing a semiconductor device and, in particular, the present invention relates to an improved method for forming a titanium nitride film using chemical vapor deposition.

2. Description of the Related Art

The chemical vapor deposition of titanium nitride will be described as an example of a conventional method for manufacturing a semiconductor device for forming a titanium nitride film in a contact hole using the CVD. FIGS. 1A through 1D are cross-sectional views showing the conventional method in the order of steps.

As shown in FIG. 1A, a lower electrode having a thickness of 500 nm is formed on an interlayer insulating film on a silicon substrate 1. An element separation oxide film 2 is formed and a predetermined amount impurities are introduced into the silicon substrate 1 thereby forming a diffused layer 3. An insulating film 4 having a thickness of 1500 nm is then deposited and a connection hole 5 is formed on the diffused layer 3.

Next, as shown in FIG. 1B, a titanium film 6 having a thickness of 10 nm and a titanium silicide film 7 having a thickness of 20 nm are deposited on the insulating film 4 and on the diffused layer 3, respectively, by the chemical vapor deposition, while using titanium tetrachloride, hydrogen and argon as material gas.

As shown in FIG. 1C, the titanium film 6 on the insulating film 4 is nitrided with ammonia thereby forming a titanium nitride film 8.

As shown in FIG. 1D, a titanium nitride film 9 having a thickness of 20 nm is formed on the titanium nitride film 8 and the titanium silicide film 7 is formed by chemical vapor deposition, using titanium tetrachloride, ammonia and nitrogen as material gases.

The problem with the conventional method for manufacturing a semiconductor device mentioned above is as follows.

The growth of a titanium nitride film by chemical vapor deposition using titanium tetrachloride requires a temperature of about 600° C. to reduce residual chlorine. Due to this, stress of about 1 GPa is generated. If such a large degree of film stress is generated, films are cracked or peeled off thereby causing the erosion of $WF_6$ by W-CVD in later steps and the silicon substrate is deformed thereby causing junction leakage. As a result, a contact electrode cannot have stable electric characteristics.

Meanwhile, Japanese Patent Application Laid-Open No. 61-156837, for example, discloses a method for relaxing stress by injecting Ar ions into a titanium nitride film of 150 nm in thickness. This manufacturing method is intended to reduce the influence on an upper aluminum wiring. If the titanium nitride film formed by sputtering is present at the bottom of a contact hole on a silicon substrate, use of Ar ions disadvantageously causes much damage to the silicon substrate.

SUMMARY OF THE INVENTION

It is therefore an object of the present invention to provide a method for manufacturing a semiconductor device capable of reducing the film stress of a titanium nitride film to the semiconductor device caused by chemical vapor deposition.

The method for manufacturing a semiconductor device according to the present invention is characterized by comprising the steps of forming a titanium nitride film on a semiconductor substrate using a chemical vapor deposition method and of injecting silicon ions.

Another method for manufacturing a semiconductor device according to the present invention is characterized by comprising the steps of:

forming a contact hole reaching a diffused layer, in an insulating film on a semiconductor substrate;

forming a titanium silicide at the bottom portion of the contact hole and depositing a titanium film;

subjecting the titanium film to nitriding treatment thereby forming a titanium nitride film; and forming a titanium nitride film using a chemical vapor deposition method and injecting silicon ions into the titanium nitride film.

According to the present invention, it is possible to reduce the stress of the titanium nitride film and, therefore, to prevent the erosion of $WF_6$ and the deformation of the silicon substrate caused by the cracking and peeling-off of films by W-CVD in later steps, and to obtain a stable electrical characteristic of the contact electrode for which junction leakage hardly occurs.

According to the present invention, crystal orientation characteristics of an aluminum film on the titanium nitride film is improved thereby enhancing the reliability of an aluminum wiring.

DESCRIPTION OF THE PREFERRED EMBODIMENTS

The preferred embodiments of the present invention will now be concretely described with reference to the accompanying drawings.

FIGS. 2A through 2D are cross-sectional views showing a manufacturing method in the first embodiment according to the present invention in the order of steps.

Figure 1A:
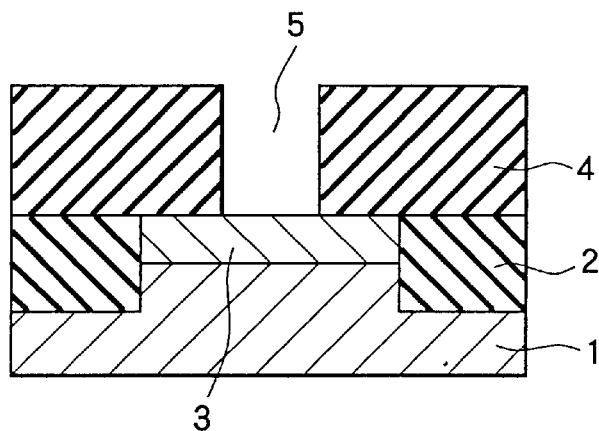
FIGS. 1A through 1D are cross-sectional views showing the conventional semiconductor device manufacturing method in the order of steps.
Figure 1B:
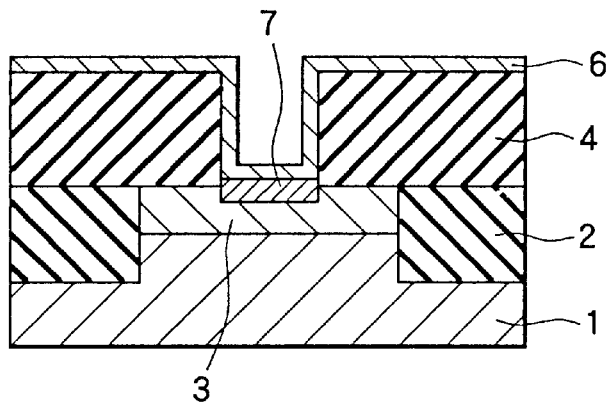
Figure 1C:
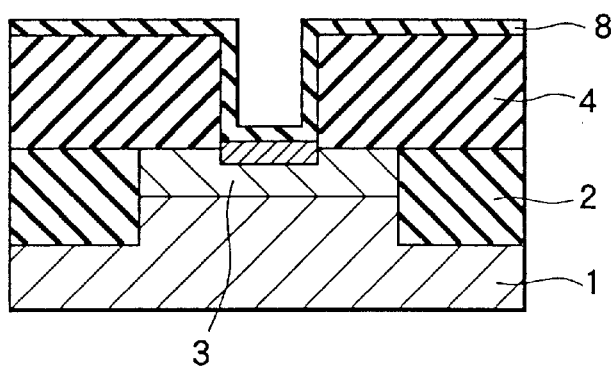
Figure 1D:
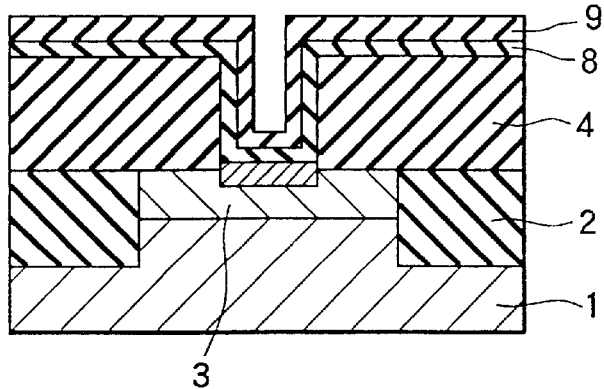
Figure 2A:
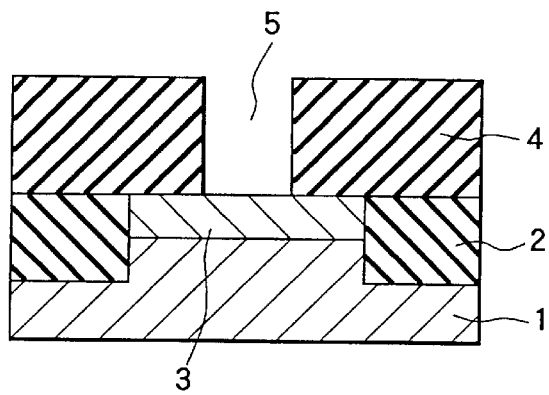
FIGS. 2A through 2D are cross-sectional views showing a manufacturing method in the first embodiment according to the present invention in the order of steps.

As shown in FIG. 2A, an element separation oxide film 2 having a thickness of 200 nm is formed on a silicon substrate. A predetermined amount of impurities are introduced into the silicon substrate 1 thereby forming a diffused layer 3. An insulating film 4 having a thickness of 2000 nm is then deposited and a contact hole 5 is provided on the diffused layer 3.

Figure 2B:
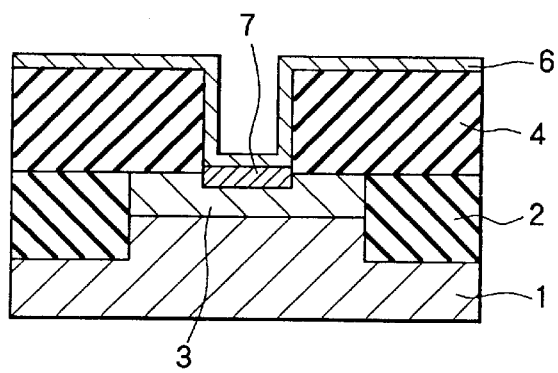

As shown in FIG. 2B, a titanium film 6 having a thickness of 10 nm and a titanium silicide film 7 having a thickness of 20 nm are deposited on the insulating film 4 and the diffused layer 3, respectively, using, as material gas, mixture gas of, for example, titanium tetrachloride of 2 sccm, hydrogen of 1000 sccm and argon of 500 sccm under conditions of a substrate temperature of 600° C., pressure of 5 T and high frequency discharge output of 500 KW by chemical vapor deposition using high frequency discharge.

Figure 2C:
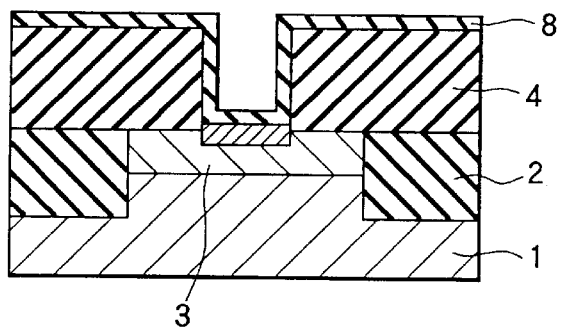

As shown in FIG. 2C, under conditions of ammonia of 100 sccm, a substrate temperature of 600° C., pressure of 20 T and high frequency discharge output of 500 kW, nitriding treatment is conducted onto the titanium film 6 on the insulating film 4 thereby forming a titanium nitride film 8.

Figure 2D:
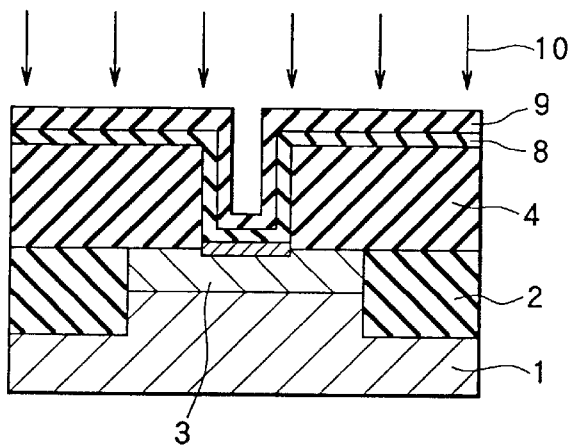

As shown in FIG. 2D, using mixture gas of titanium tetrachloride of 40 sccm, ammonia of 100 sccm and nitrogen of 3000 sccm as material gas, a titanium nitride film 9 of 20 nm in thickness is formed on the titanium nitride film 8 under the conditions of a substrate temperature of 600° C. and pressure of 20 T by chemical vapor deposition. It is noted that the titanium nitride film 9 has a tensile stress of about 1 GPa. Thereafter, silicon ions 10 are injected into the titanium nitride film 9 under conditions of acceleration voltage of 50 keV and dosage of $1\times10^{15}/cm^2$. As a result of this treatment, film density is increased and tensile stress is reduced to about 0.5 GPa.

The second embodiment according to the present invention will next be described.

Similarly to the method described in the first embodiment above, a titanium nitride film 9 is formed in a contact hole using chemical vapor deposition and silicon ions are injected (see FIG. 2D). Thereafter, heat treatment is conducted at 700° C. for about 30 seconds under the atmosphere of inert gas, such as nitrogen, by quick heating treatment and the titanium nitride film is re-crystallized.

According to the second embodiment, it is possible to reduce the stress of the titanium nitride film and therefore to prevent the erosion of $WF_6$ and the deformation of the silicon substrate caused by the cracking and the peeling-off of the films in W-CVD in later steps. As a result, it is possible to obtain the stable electric characteristics of the contact electrode for which junction leakage hardly occurs.

Moreover, the heat treatment shown in the embodiments of the present invention enables crystal orientation characteristics of an aluminum film on the titanium nitride film to improve thereby realizing the improved reliability of an aluminum wiring.

What is claimed is:

1. A method for manufacturing a semiconductor device comprising the steps of:

forming a titanium nitride film on a semiconductor substrate using a chemical vapor deposition method; and injecting silicon ions into said titanium nitride film.

2. A method for manufacturing a semiconductor device comprising the steps of:

forming a contact hole in an insulating film on a semiconductor substrate;

forming a titanium nitride film using a chemical vapor deposition; and injecting silicon ions into said titanium nitride film.

3. A method for manufacturing a semiconductor device comprising the steps of:

forming a contact hole reaching a diffused layer, in an insulating film on a semiconductor substrate;

forming a titanium silicide at a bottom portion of said contact hole;

forming a titanium nitride film using a chemical vapor deposition method; and injecting silicon ions into said titanium nitride film.

4. A method for manufacturing a semiconductor device according to claim 3, comprising a step of re-crystallizing said titanium nitride film by quick heat treatment after said silicon ion injection step.

* * * * *